United States Patent [19]
Matsuo et al.

[11] Patent Number: 5,524,170
[45] Date of Patent: Jun. 4, 1996

[54] VECTOR-QUANTIZING DEVICE HAVING A CAPABILITY OF ADAPTIVE UPDATING OF CODE BOOK

[75] Inventors: Naoshi Matsuo; Koji Okazaki, both of Kawasaki, Japan

[73] Assignee: Fujitsu Limited, Kawasaki, Japan

[21] Appl. No.: 261,208

[22] Filed: Jun. 15, 1994

Related U.S. Application Data

[63] Continuation of Ser. No. 933,793, Aug. 24, 1992, abandoned.

[30] Foreign Application Priority Data

Aug. 30, 1991 [JP] Japan .................................. 3-220320

[51] Int. Cl.[6] ........................................... G10L 9/00
[52] U.S. Cl. ............................... 395/2.31; 395/2.3
[58] Field of Search .............................. 395/2.28–2.39; 381/29–40; 358/133, 135

[56] References Cited

U.S. PATENT DOCUMENTS 5,007,092  4/1991  Galand et al. .......................... 381/36
5,194,950  3/1993  Murakami et al. ..................... 358/133
8,068,723 11/1991  Dixit et al. ............................. 358/135

*Primary Examiner*—Allen R. MacDonald
*Assistant Examiner*—Michelle Doerrler
*Attorney, Agent, or Firm*—Staas & Halsey

[57] ABSTRACT

A vector-quantizing device comprises a first code book for storing a plurality of code vectors at respective addresses; a first addressing unit for selecting a code vector stored in the first code; a synthesis unit supplied with the code vector from the first code book for producing a synthetic signal that simulates an input signal; an evaluation unit supplied with the input signal and further with the synthetic signal from the synthesis means for evaluating a difference therebetween and searching for a code vector that minimizes the difference. There, the evaluation unit produces the first index data that specifies a code vector wherein the difference is minimized as a coded output. In addition, the vector-quantizing device includes a second code book for storing a plurality of code vectors at respective addresses; a second addressing unit for selecting a code vector stored in the second code book: and an update unit for counting the frequency of selection of the code vectors for each of the code vectors stored in the first code book. There, the update unit is for replacing a code vector in the first code book, when the frequency of use of the code vector is below a predetermined threshold, with a code vector in the second code book.

12 Claims, 8 Drawing Sheets

$a_1$ $a_3$ $a_5$ ----
$a_2$ $a_4$ $a_6$ ----
$(a_1 a_2)(a_3 a_4)$ ----

VECTOR-QUANTIZING DEVICE HAVING A CAPABILITY OF ADAPTIVE UPDATING OF CODE BOOK

This application is a continuation, of U.S. application Ser. No. 07/933,793, filed Aug. 24, 1992, now abandoned.

BACKGROUND OF THE INVENTION

The present invention generally relates to vector-quantizing devices and more particularly to a vector-quantizing device that has a code book wherein the content of the code book is optimized adaptively.

The technique of vector quantization is used extensively for speech recognition as well as for transmission of various signals such as video signals or audio signals with data compression. In the digital telephone systems for transmitting speech signals via a communication line, in particular, the vector-quantization provides a powerful means for reducing the bit rate.

FIG. 1 shows an example of the spectrum of human speech. As will be noted in FIG. 1, the human speech is basically formed of a component having a periodic and random noise spectrum produced at the voice cord, and such a signal component is modulated as result of change of the transfer characteristic at the vocal tract. Thus, the transfer of the speech signal having a spectrum as shown in FIG. 1 requires transmission of a large amount of information, and hence, there is a need of a large bandwidth for the transmission channel.

In the vector-quantization of speech signals, a reference signal having a white noise spectrum as shown in FIG. 2 is produced and sampled with a predetermined clock. The samples thus obtained such as $a_1, a_2, a_3, a_4 \ldots$ are grouped into a number of groups called code vectors such as $(a_1, a_2)$, $(a_3, a_4), \ldots$, and are stored in a memory device called code book together with respective index data.

When compressing a speech signal in transmission side, the code vectors thus stored in the code book are read out therefrom one by one by changing the index, and a speech signal is reproduced by processing the code vectors in a synthetic filter. There, the code vector that produces a signal that approximates the input speech signal with the smallest error is selected and the index data of the code vector is transmitted over the transmission line. In the reception side, a code book having the identical construction and content is provided, and the code vector is selected based upon the index data transmitted over the transmission line. By processing the code vector in a speech synthesis filter that corresponds to the speech synthesis filter of the transmission side, one can reproduce the speech signal successfully.

FIG. 3 shows the construction of a conventional vector-quantizing device used in the transmission side of a telecommunication system.

Referring to FIG. 3, the device includes a coding unit 1 that includes therein a code book and an addressing circuit for selectively reading out the code vector from the code book. The selected code vector is then supplied to a synthesis unit 2 for reproducing speech sample data from the code vector. Typically, the unit 2 is provided by a feedback filter that simulates the acoustic characteristics of the vocal tract. The reproduced speech data is then compared with an input speech signal at a subtracter 3 where a deviation of the reproduced speech signal from the input speech signal is calculated, and the output of the subtracter 3 indicating the deviation is supplied to an evaluation unit 4 that calculates the square of the deviation signal. When the evaluation is completed for all of the code vectors, the evaluation unit 4 evaluates the foregoing square deviation for each of the code vectors in the code book and selects the code vector that provides the smallest square deviation. Thereby, the index data that corresponds to the selected code vector is transmitted along the transmission line. Thereby, one can achieve a data compression by sending the index of the code vector instead of the digital speech signal itself.

On the other hand, the quantizing device of this prior art has a problem, associated with the use of fixed code book, in that there is a tendency that some of the code vectors are used frequently while other code vectors are not used. Further, such frequently used code vectors and unused code vectors may change when the person who speaks has changed. Thus, the conventional device of FIG. 1 has to have a large code book that stores therein a very large number of code vectors. Thereby, one needs a large number of bits for addressing the code vectors in the code book and the efficiency of data compression is inevitably deteriorated.

FIG. 4 shows another conventional vector-quantizing device that is used for training the code book for improving the quality of reproduced signals.

In the device of FIG. 4, there is provided a code book 5 for storing the code vectors, and an addressing unit 6 selects the code vectors stored in the code book 5. The code vector read out from the code book 5 as a result of addressing by the unit 6 is then supplied to a synthetic filter 7 that corresponds to the synthesis unit 2 of FIG. 3. There, the speech data is synthesized from the selected code vector and is compared with the input speech signal at a subtracter 8. There, the subtracter 8 calculates the difference between the input speech signal and the synthesized speech data and produces an output signal indicative of the difference. This output signal is then supplied to an evaluation unit 9 corresponding to the unit 4 of FIG. 3 for calculating the square of the output signal of the subtracter unit 8. Further, the unit 9 activates the unit 6 for changing the code vector until a code vector that minimizes the square of deviation is found. Further, the index of the code vector thus found is transmitted over the transmission line similarly to the device of FIG. 3. When the device of FIG. 4 is used in the reception side, on the other hand, the output of the filter 7 is outputted as the synthetic speech signal.

Further, the circuit of FIG. 4 includes a training unit 10 that is supplied with the input signal as a training signal for a predetermined interval. There, training unit 10 modifies the content of each selected code vector such that the deviation detected by the unit 9 is minimized. Thereby, one can train the code book 5 such that the distortion of vector-quantization is minimized.

In the device of FIG. 4, however, there exists a problem in that, although those code vectors that are selected frequently are optimized by the training, the code vectors that are less frequently selected or not selected at all do not experience the desired training. Thereby, there can occur a large distortion associated with the reduced number of the effective or "active" code vectors that are actually selected during the data compression of the speech signals.

SUMMARY OF THE INVENTION

Accordingly, it is a general object of the present invention to provide a novel and useful vector-quantizing device, wherein the foregoing problems are eliminated.

Another and more specific object of the present invention is to provide a vector-quantizing device that is capable of updating the content of the code book such that the code book contains only those code vectors that are used with more or less the same frequency.

Another object of the present invention is to provide a vector-quantizing device for decompressing an input signal by a vector-quantization process, comprising: a first code book for storing a plurality of code vectors at respective indices; encoding means for selecting a code vector stored in said first code book, said coding means producing an encoded output as index data indicative of the index of said selected code vector; synthesis means supplied with said selected code vector from said first code book for producing a synthetic signal that simulates said input signal; evaluation means supplied with said input signal and further with said synthetic signal from said synthesis means for evaluating a difference therebetween, said evaluation means controlling said encoding means in response to said difference such that a code vector that minimizes said difference is selected; a second code book for storing a plurality of code vectors at respective indices; and update means for counting the frequency of selection of said code vectors for each of said code vectors stored in said first code book, said update means replacing a code vector in said first code book, when the frequency of use of said code vector is below a predetermined threshold, with a code vector stored in said second code book. According to the present invention, one can modify the content of the first code book such that the first code book contains only those code vectors of which frequency of usage exceeds the predetermined threshold. In other words, the code vectors in the code book have a relatively uniform frequency of use. Thereby, one can reduce the distortion accompanying the vector quantization, and the quality of the speech signal reproduced at the reception side is significantly improved, particularly when the vector-quantizing device is used in a telecommunication system.

Other objects and further features of the present invention will become apparent from the following detailed description when read in conjunction with the attached drawings,

DETAILED DESCRIPTION OF THE PREFERRED EMBODIMENTS

Figure 5:
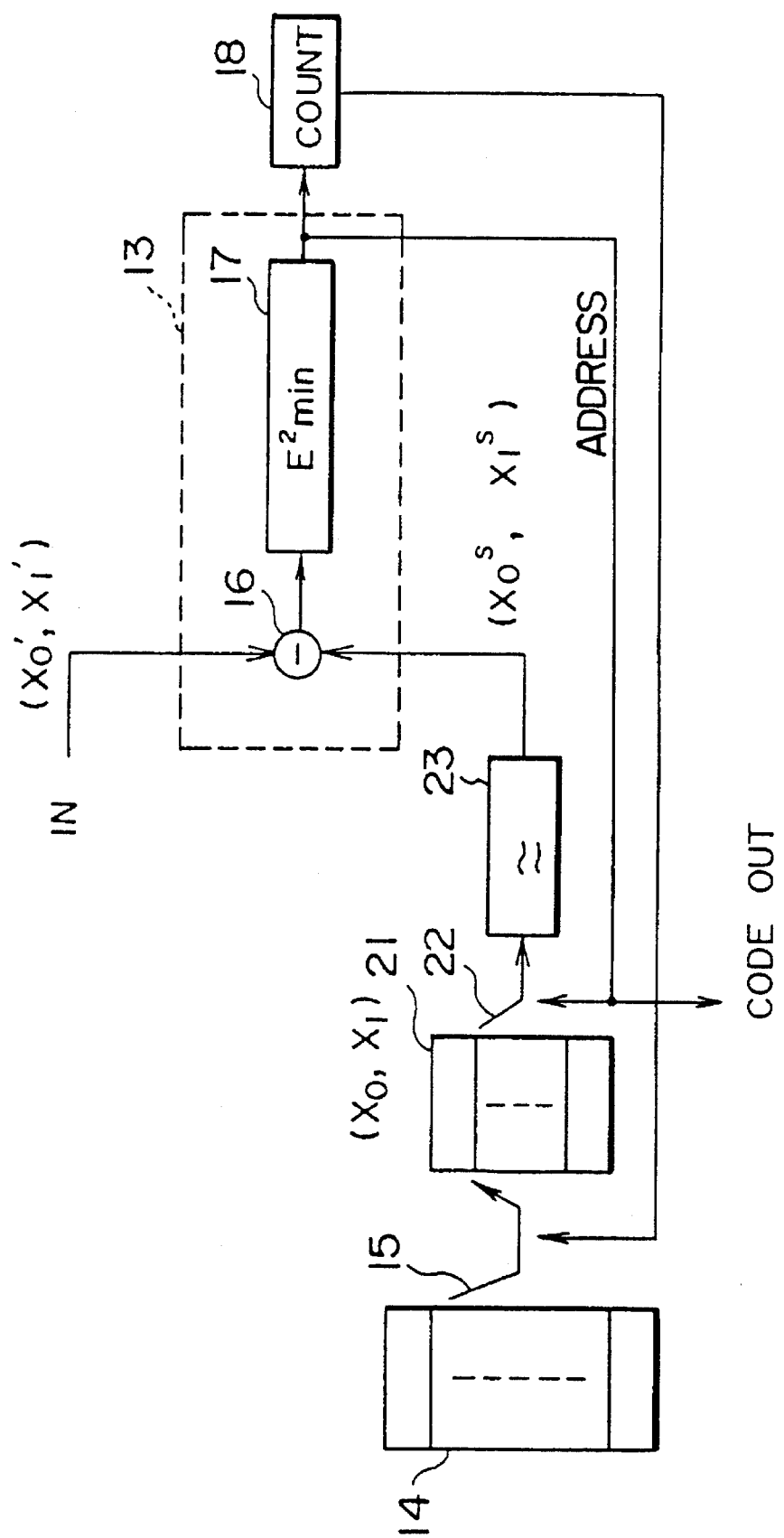
FIG. 5 is a block diagram showing the construction of a vector-quantizing device according to a first embodiment of the present invention.

FIG. 5 shows the construction of the vector-quantizing device according to a first embodiment of the present invention.

Figure 1:
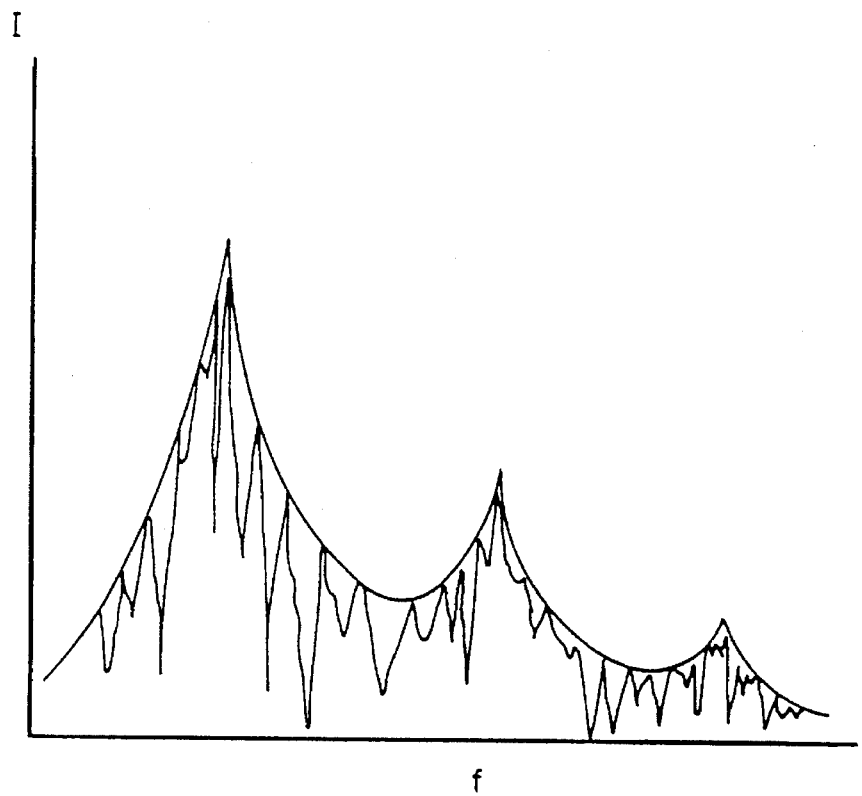
FIG. 1 is a diagram showing a typical spectrum of a speech.
Figure 2:
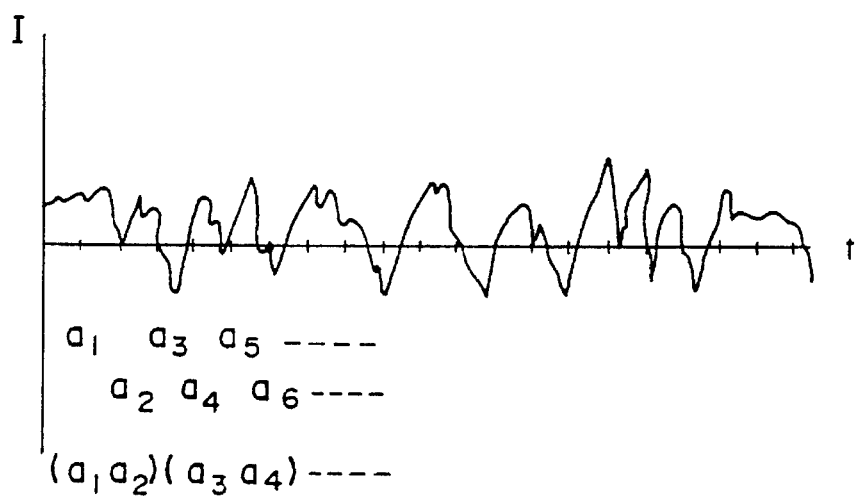
FIG. 2 is a diagram showing the sampling of a random noise signal for creating code vectors used in the vector quantization.
Figure 3:
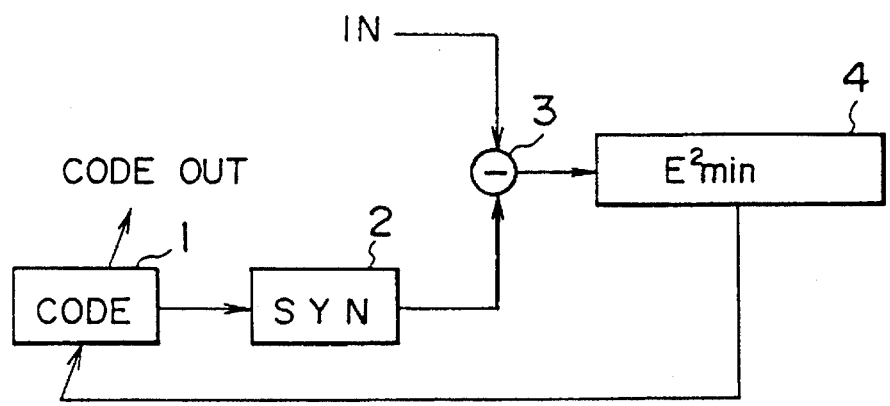
FIG. 3 is a block diagram showing the construction of a conventional vector-quantizing device.
Figure 4:
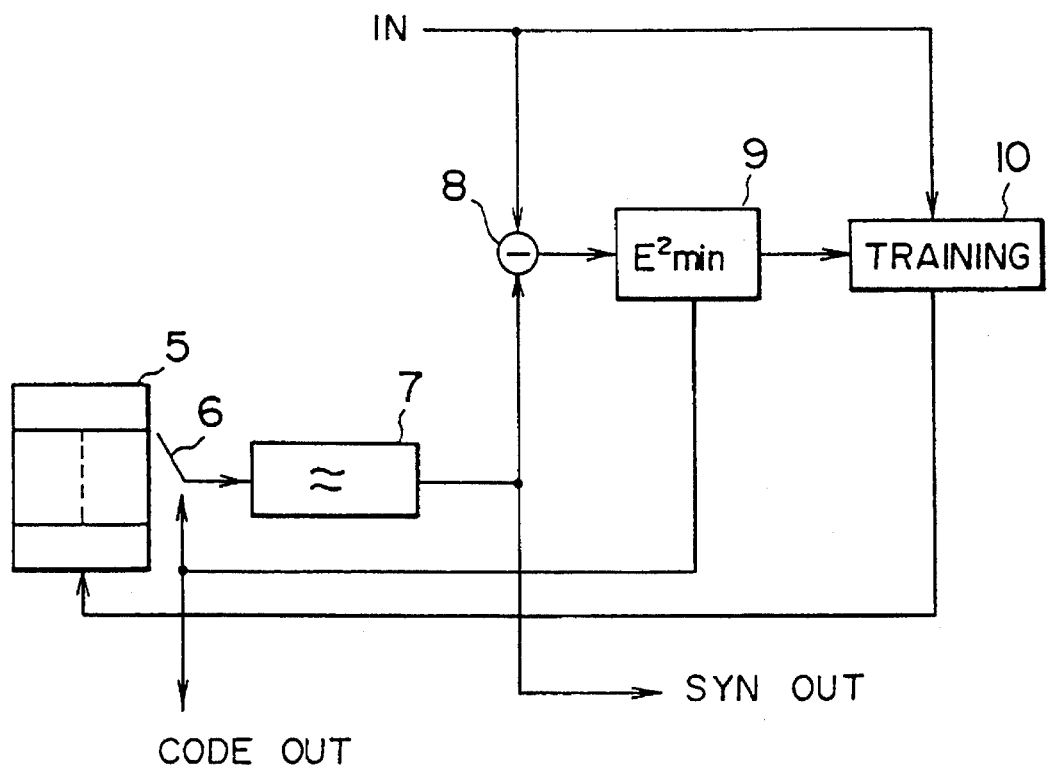
FIG. 4 is a block diagram showing the construction of another conventional vector-quantizing device.

Referring to FIG. 5 the vector-quantizing device of the present embodiment includes a code book 21 corresponding to the code book 5 of FIG. 4 for storing a number of code vectors such that the code vectors stored in the code book 21 are addressed by an addressing unit 22 that corresponds to the unit 6 of FIG. 4. There, a selected code vector is read out from the code book 21 and supplied to a synthesis filter 23 corresponding to the filter 7 of FIG. 4. Further, the output of the filter 23 is supplied to a subtracter unit 16 for subtraction from an input signal that is supplied also to the unit 16. The subtracter unit 16 produces an output signal indicative of the difference therebetween and supplies the same to an evaluation unit 17 that corresponds to the unit 9 of FIG. 4.

There, the unit 17 calculates the square of the difference represented by the output signal of the subtracter 16 for each of the code vectors stored in the code book 21. For this purpose, the unit 17 produces index data ADDRESS and controls the addressing unit 22. Further, the unit 17 produces a count signal indicative of the addressing of the code vector for each of the code vectors in the code book 21 and the count signal is counted in a counter 18.

When an input signal vector $(X_0', X_1')$ comes in, the addressing unit 22 selects one of the code vectors such as a code vector $(X_0, X_1)$ in the code book 21 and outputs the same to the synthesis filter 23. There, the code vector $(X_0, X_1)$ is converted to a signal code vector $(X_0^s, X_1^s)$ after experiencing a transfer characteristic of the filter 23, and a difference $(X_0'-X_0^s, X_1'-X_1^s)$ is calculated in the subtracter 16. Further, the unit 17 calculates the square difference of the vectors as $$E^2=(X_0'-X_0^s)^2+(X_1'-X_1^s)^2.$$

Further, such a square difference $E^2$ is calculated in the unit 17 for each of the code vectors in the code book 21 by selecting the next code via the addressing unit 22. By selecting the code vector that provides the smallest square difference $E_{min}^2$ and sending the index data of such a code vector, the vector-quantizing device achieves the desired data compression. Typically, the code book 21 may include 128 code vectors in the index starting from 0 and ending at 127. Thereby, one can compress the input speech date to 7 bit digital data.

In the circuit of FIG. 5, it should be noted that there is provided another code book 14 such that the code book 14 replaces the code vector in the code book 21. For this purpose, there is provided another addressing unit 15 such that the unit 15 addresses the code vector in the code book 21 consecutively one after another and replaces the code vector in the code book 21 when the number of counts, counted by the counter 18 for the code vector under consideration, is smaller than a predetermined threshold. There, it should be noted that the counter 18 counts the frequency of use of the code vector for a predetermined interval for each of the input signal vector $(X_0', X_1')$. In addition to the foregoing threshold function, the addressing unit 15 achieves an addressing of the second code book 14 for selecting a code vector that is used for substituting the code vector in the code book 21. There, the addressing unit 15 selects a next code vector in the code book 14 each time a code vector in the code book 14 is selected.

As a result of such a modification or updating of the code book 21, the code vectors that are used seldom are discarded and replaced by another, more frequently used code vector. Thereby, the code book 21 is updated to store only those code vectors that are used frequently after running for a predetermined duration.

Figure 6:
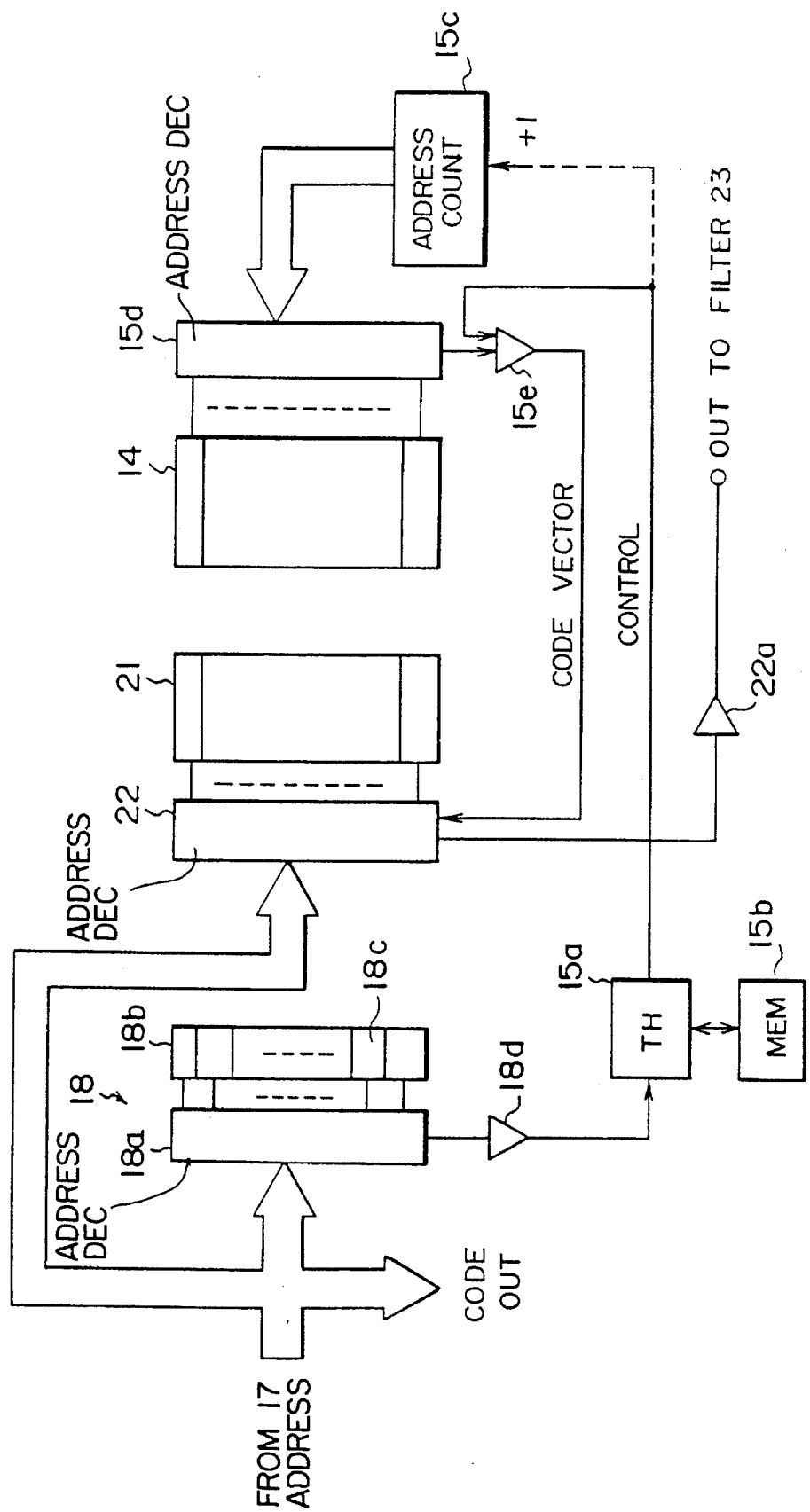
FIG. 6 is a block diagram showing the essential part of FIG. 5.

FIG. 6 shows the construction of the essential part of the device of FIG. 5.

Referring to FIG. 6, there is provided an index decoder as the addressing unit 22, and the index decoder 22 selects the code vector stored in the code book 21 in response to the index data ADDRESS supplied from the evaluation unit 17. In response to the addressing, the code vector in the code book 21 is read out and supplied to the synthesis filter 23 via a buffer amplifier 22a. Further, it will be noted that the counter 18 of FIG. 5 is provided as an assembly 18b of counters that includes counters 18c with a number corresponding to the number of the addresses in the code book 21. Further, reading and writing of the counters 18c are achieved by an index decoder 18a that is supplied with index data ADDRESS from the evaluation unit 17. Thus, each time a code vector in the code book 21 is selected, the count in the counter 18c corresponding to the code vector is increased by one.

When updating the code book 21, the index data ADDRESS for selecting the code vectors in the code book 21 is changed consecutively, and the content of the counter 18c is read out in response to the index data ADDRESS thus given. Further, the count thus read out is supplied to a threshold detection unit 15a via a buffer amplifier 18d. There, the threshold detection unit 15a is supplied with a threshold data from a memory unit 15b and produces a control signal when the count stored in the selected counter 18c is smaller than the count provided by the memory 15b. This control signal is used for activating the updating of the code vector in the code book 21 as described below.

It will be noted that there is provided another index decoder 15d adjacent to the code book 14 for selecting the code vectors stored therein. Further, the index decoder 15d is supplied with index data generated by an index counter 15c. More specifically, the index decoder 15d selects a code vector in the code book 14 in response to the index data given by the index counter 15c, and the code vector thus selected is read out from the code book 14 via a buffer amplifier 15e. There, the control signal produced by the threshold detection unit 15a is used for activating the buffer amplifier 15e. Thus, in response to the activation of the buffer amplifier 15e, the code vector in the code book 14 at the index selected by the index counter 15c is transferred to the code book 21 via the index decoder 22 and replaces the code vector at the index selected by the index decoder 22.

It should be noted that the index counter 15c may be a counter that runs independently and changes the index data consecutively, or a counter that increases the index data by 1 in response to the control signal from the threshold detection unit 15a. Further, as will be described later with reference to other embodiment, the index counter 15c may be a random number generator for generating the index data at random.

Figure 7:
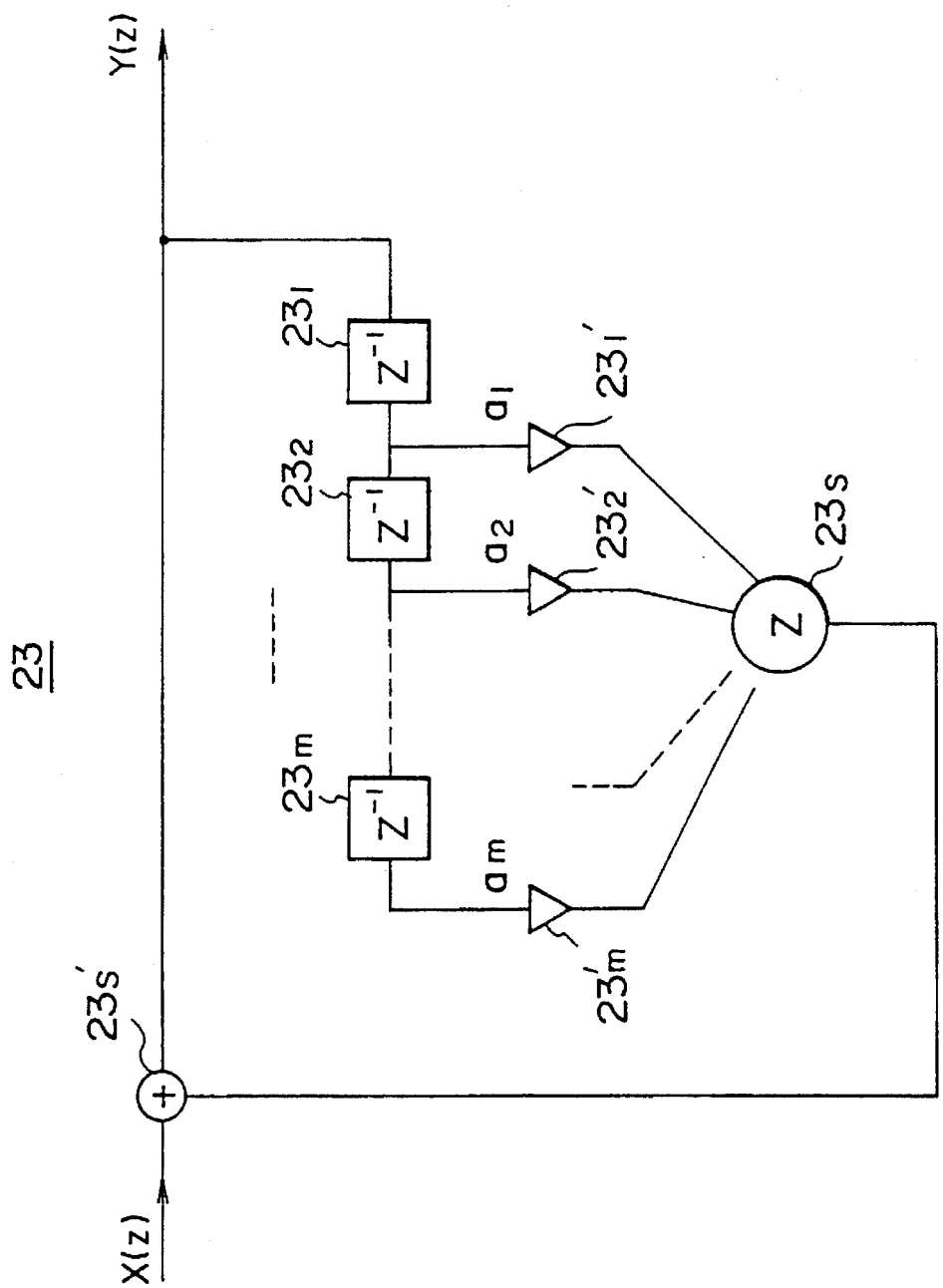
FIG. 7 As a block diagram showing the construction of a synthetic filter used in the circuit of FIG. 5

FIG. 7 shows the construction of the synthesis filter 23 that is used in the circuit of FIG. 5.

Referring to FIG. 7, the filter 23 is a digital filter of the feedback type for simulating the reverberation occurring in the vocal tract according to the relationship $$y(t_i)=x(t_i)+a_1 y(t_{i-1})+ \ldots +a_m y(t_{i-m}),$$

and includes delay circuits $23_1$–$23_m$ for delaying the input signal and coefficient circuits $23_1'$–$23_m'$ respectively corresponding to the delay circuits $23_1$–$23_m$ for multiplying the coefficients $a_1$–$a_m$ to the signals delayed by the corresponding delay circuits. The output of the coefficient circuits $23_1'$–$23_m'$ are then added with each other at a summation circuit $23_s$, and the output of the summation circuit $23_s$ is added to the input signal at a summation circuit $23s'$.

Figure 8:
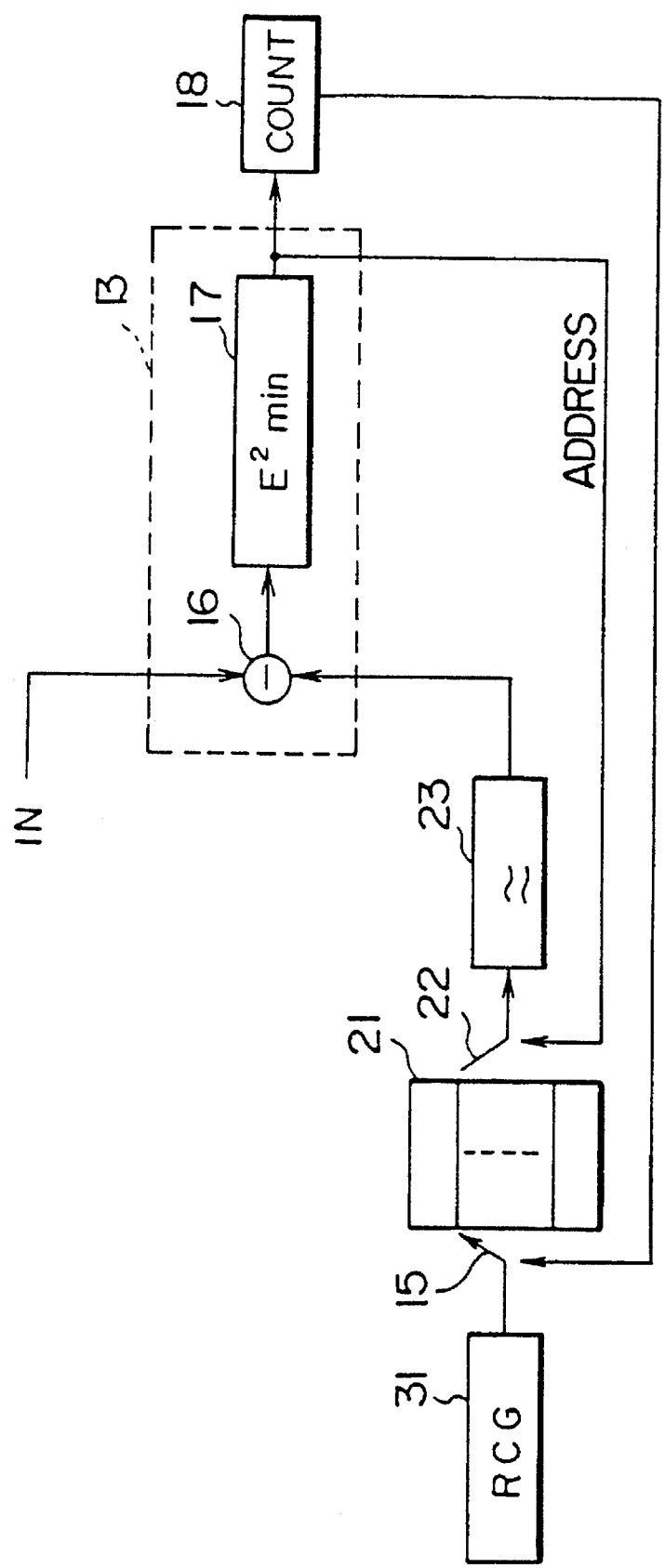
FIG. 8 is a block diagram showing the construction of a vector-quantizing device according to a second embodiment of the present invention.

FIG. 8 shows a second embodiment of the present invention.

Referring to FIG. 8, a random code generator 31 is provided in place of the second code book 14 and the random code or number produced in the random code generator 31 is used for substituting for the code vector in the code book 21. Other aspects of the present embodiment is substantially the same as the first embodiment and further description will be omitted.

Figure 9:
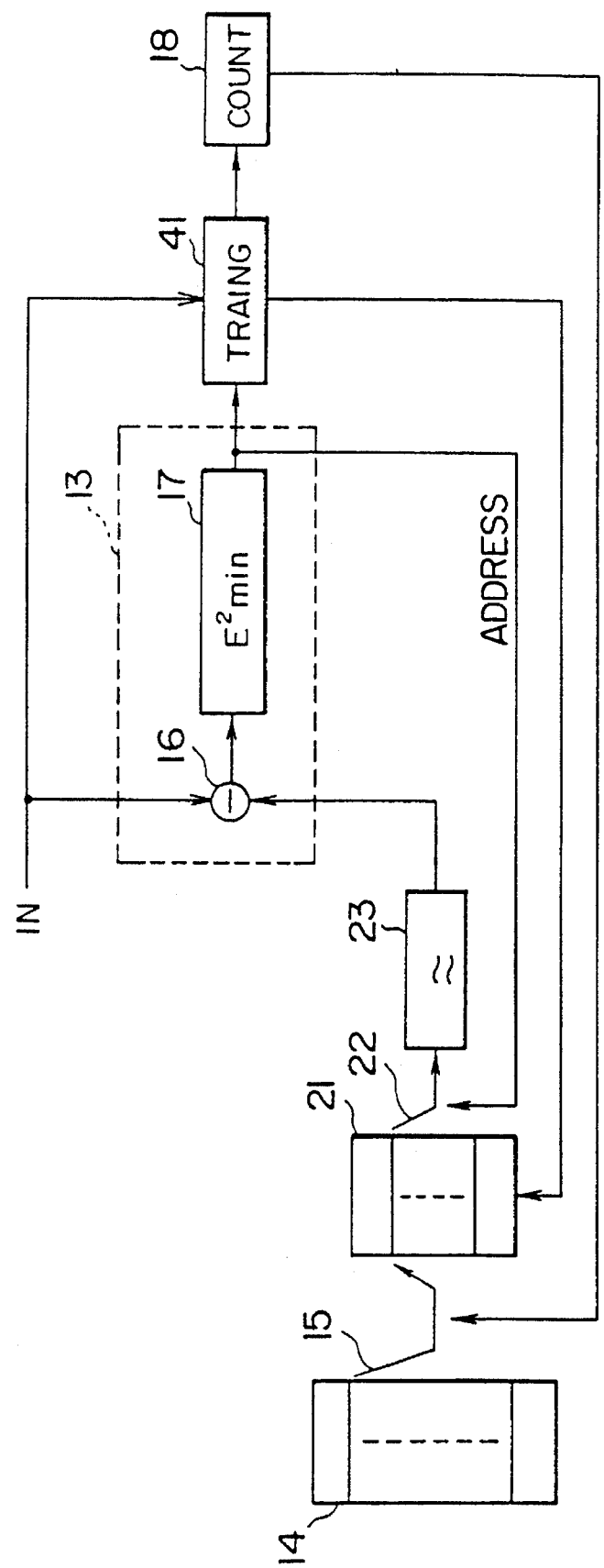
FIG. 9 is a block diagram am showing the construction of a vector-quantizing device according to a third embodiment of the present invention.

FIG. 9 shows a third embodiment of the present invention wherein there is provided a training circuit 41 for training the code vectors stored in the code book 21. Thereby, the code vectors that are selected by the addressing unit 22 is subjected to a training or modification in response to the input signal during a training interval, and the code book is optimized against the input speech signal. As the code vectors that are not used frequently are discarded in the device of the present invention, all the code vectors in the code book of the device of FIG. 9 experience the training and the distortion associated with the vector-quantization data compression is minimized.

Figure 10A:
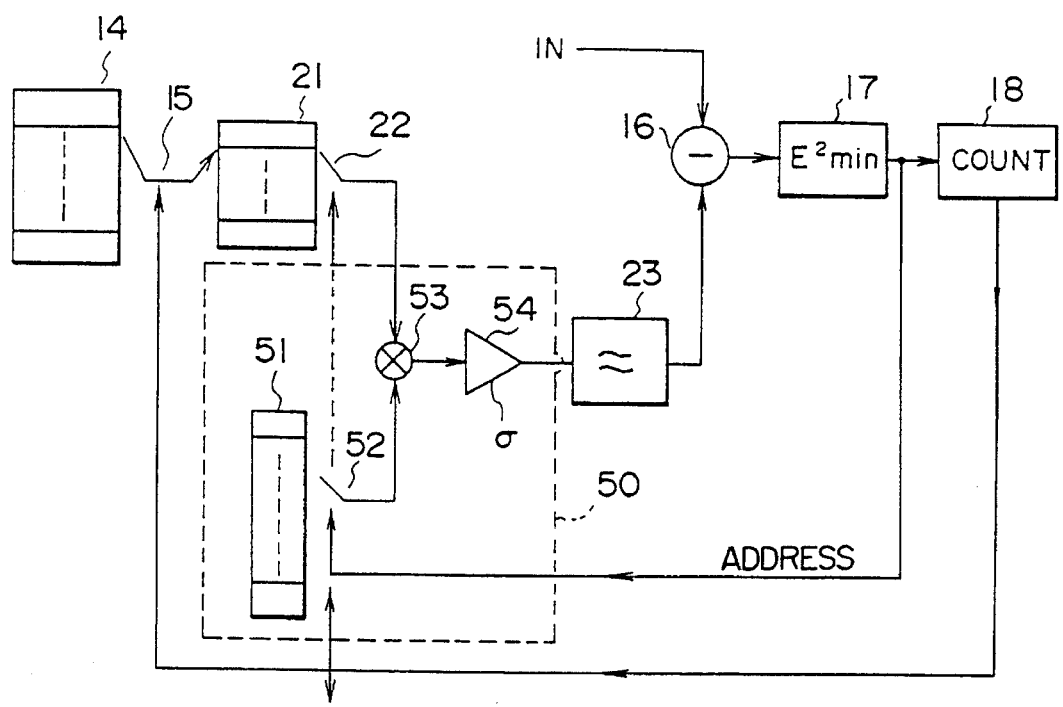
FIGS. 10(A) and 10B) are diagrams showing the construction of a telecommunication system wherein a vector-quantizing device at the transmission side is connected to a vector-quantizing device at the reception side via a telecommunication line.
Figure 10B:
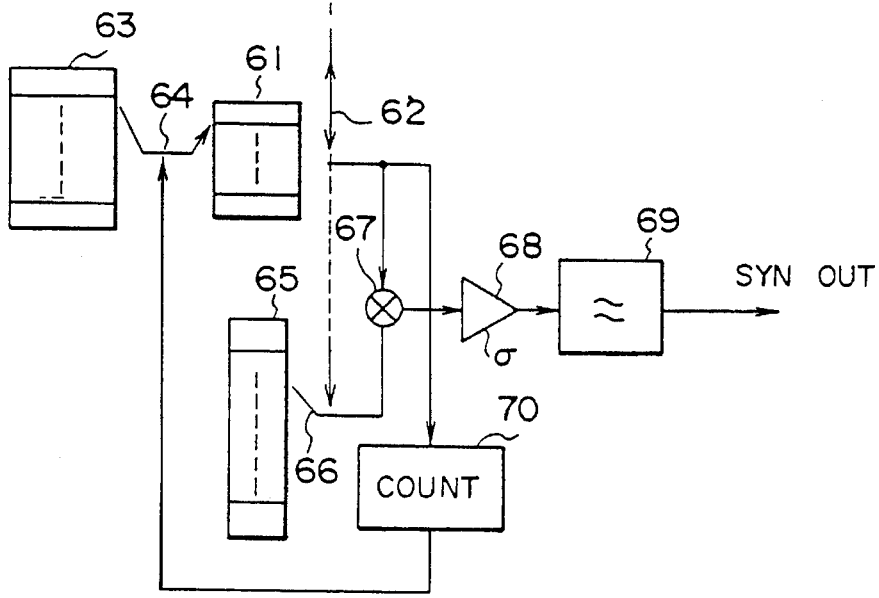

FIGS. 10(A) and 10(B) show a telecommunication system wherein the data compression and decompression is achieved by the vector-quantizing device of the present invention.

Referring to FIG. 10(A) showing the transmission side, there is provided a vector-quantizing device substantially identical with the device of FIG. 5 as an encoder except that there is provided a gain controller 50 for encoding data indicative of the gain of the input signal.

There, the gain controller 50 includes a gain code book 51 for storing gain code values representing the magnitude of the input signal, and an addressing unit 52 selectively reads out the gain code values from the code book 51 under the control of the evaluation unit 17. There may be eight different gain code values with the index represented by 3 bit data. The gain code value thus read out from the code book 51 is multiplied to the shape code vector that has been read out from the code book 21 at a multiplier 53, and the data thus produced by the multiplier 53 is amplified in a gain amplifier 54 with a gain σ that is determined by the gain code value read out from the code book 51. As the addressing unit 52 is controlled by the evaluation unit 17 such that the square deviation $E^2$ becomes minimum, the selection of the optimum gain code value and hence the extraction of the index data of the optimum gain code value is guaranteed.

In the present embodiment, too, the updating of the code book 21 by the shape code vectors stored in the code book 14 is achieved similarly to the foregoing embodiment. Further, such an updating of the code book may by applied also to the code book 51 by providing an additional code book.

The index data of the optimum code vectors thus selected by the evaluation unit 17 is then transferred to a reception side via a transmission line. When the code book 21 includes 128 shape code vectors and the code book 51 includes 8 gain code values as mentioned previously, 10 bit data is used for the transmission of necessary information.

FIG. 10(B) shows the vector-quantizing device used in the reception side for reproducing the speech signal from the transmitted data.

Referring to FIG. 10(B), the reception side device has a construction similar to the device of the transmission side in that there is provided a code book 61 corresponding to the code book 21, and the shape code vectors stored in the code book 61 are read out therefrom by an addressing unit 62 that corresponds to the addressing unit 22. Further, there is provided a code book 63 for updating the shape code vectors stored in the code book 61 via an addressing unit 64 that corresponds to the addressing unit 64. In addition, there is provided a code book 65 corresponding to the code book 51 for storing the gain code values and an addressing unit 66 corresponding to the addressing unit 52 reads out the gain code values stored in the code book 65.

It should be noted that the data transmitted over the transmission line is supplied to the addressing unit 62 and further to the addressing unit 66 such that the index data that represents the index of the optimum shape code vector in the code book 21 is supplied to the addressing unit 62. Further the index data that represents the index of the optimum gain code value in the code book 51 is supplied to the addressing unit 66. Such a separation of the data is achieved easily by using the upper 3 bit data of the transmitted 10 bit data for the addressing of the gain code value in the code book 65 and by using the lower 7 bit data for the addressing of the shape code vectors in the code book 61.

The code vectors thus read out from the code books 61 and 65 are then multiplied with each other in a multiplier 67 that corresponds to the multiplier 53, and the multiplier 67 produces an output to a gain amplifier 68 corresponding to the gain amplifier 54. Further, the shape code vectors read out from the code book 61 is counted with respect to the frequency of use in a counter 70 that corresponds to the counter 18, and the counter controls the addressing unit 64 for updating those shape code vectors of which frequency of use is below a predetermined threshold, which is set identical with the threshold used when updating the shape code vectors by the addressing unit 15. Thereby, the addressing unit 64 operates exactly identical with the addressing unit 15. As the frequency of use of the code vectors in the code book 61 is identical with the shape code vectors in the code book 21, the updating of the code book 61 is achieved exactly identical with the updating of the code book 21. In other words, the telecommunication system of FIGS. 10(A) and 10(B) does not require the transmission of information about the updating of the code book separately to the transmission of data.

The output of the multiplier 67 is then supplied to a gain amplifier 68 corresponding to the gain amplifier 54 where the gain σ is adjusted in accordance with the output of the amplifier 68. Further, the output of the amplifier 68 representing the optimized code vector of the code books 61 and 65 multiplied with the optimized gain σ, is then passed through a synthesis filter 69 that corresponds to the synthesis filter 23 for simulating the acoustics of the vocal tract. Thereby, a synthetic speech signal is obtained as an output of the filter 69.

Further, the present invention is not limited to the embodiments described heretofore, but various variations and modifications may be made without departing from the scope of the invention.

What is claimed is:

1. A vector-quantizing device for coding an input signal by a vector-quantization process, comprising:

a first code book for storing a plurality of code vectors at respective addresses;

first addressing means supplied with first index data for selecting a code vector stored only in said first code book in response to said first index data;

synthesis means supplied with only said selected code vector from said first code book for producing a synthetic signal that simulates said input signal;

evaluation means supplied with said input signal and further with said synthetic signal from said synthesis means for evaluating a difference therebetween, said evaluation means searching for a code vector that minimizes said difference in said first code book, transmitting said first index data that specifies a code vector wherein said difference is minimized as a coded output and producing a count signal each time a code vector in said first code book is selected;

a second code book for storing a plurality of code vectors at respective addresses;

second addressing means supplied with second index data for selecting a code vector stored in said second code book;

counting means for counting a frequency of selection of the code vectors for each of said code vectors only stored in said first code book using said count signal; and update means for producing said second index data and replacing a code vector stored in said first code book and addressed by said first index data, when said frequency of selection of said code vector stored in said first code book and addressed by said first index data is below a predetermined threshold, with a code vector stored in said second code book and addressed by said second index data.

2. A vector-quantizing device as claimed in claim 1 in which said update means comprises:

threshold means supplied with the result of counting from said counting means for each of said code vectors in said first code book and further with a predetermined threshold for identifying the code vectors in said first code book that are selected with a frequency smaller than said predetermined threshold;

second index data generation means for producing said second index data;

and data transfer means for transferring the code vector stored in said second code book, when addressed by said second index data, to said first code book such that the code vector in said first code book and identified by said threshold means as being the code vector of which frequency of selection is smaller than said predetermined threshold, is overwritten by said code vector transferred from said second code book.

3. A vector-quantizing device as claimed in claim 2, wherein said counting means comprises a plurality of counters provided in correspondence to each index of the code vectors in said first code book, and said evaluation means supplies said first index data to said counting means as said count signal.

4. A vector-quantizing device as claimed in claim 2, wherein said data transfer means comprises a buffer amplifier for reading out the code vector from said second code book via said second addressing means and for writing the same into said first code book via said first addressing means.

5. A vector-quantizing device as claimed in claim 2, wherein said second index data generation means comprises an index counter for counting a number of times the code vectors in said first code book is overwritten and produces said number as said second index data.

6. A vector-quantizing device as claimed in claim 2, wherein said second index data generation means comprises an index counter running at a predetermined rate and producing a counted number as said second index data.

7. A vector-quantizing device as claimed in claim 2, wherein said second index data generation means comprises a random number generator that produces a random number as said second index data.

8. A vector-quantizing device as claimed in claim 1, wherein said device further comprises a training circuit supplied with said input for signal for modifying said code vectors stored in said first code book such that said difference evaluated by said evaluation means is minimized.

9. A coder that uses a vector-quantizing device comprising:

an encoder; and a decoder;

said encoder comprising:

a first code book for storing a plurality of code vectors at respective addresses;

first addressing means supplied with first index data for selecting a code vector stored only in said first code book in response to said first index data;

synthesis means supplied only with said selected code vector from said first code book for producing a synthetic signal that simulates said input signal;

evaluation means supplied with said input signal and further with said synthetic signal from said synthesis means for evaluating a difference therebetween, said evaluation means searching for a code vector that minimizes said difference in said first code book, transmitting said first index data that specifies a code vector wherein said difference is minimized as a coded output and producing a count signal each time a code vector in said first code book is selected;

a second code book for storing a plurality of code vectors at respective addresses;

second addressing means supplied with second index data for selecting a code vector stored in said second code book;

counting means for counting the frequency of selection of the code vectors for each of said code vectors only stored in said first code book using said count signal; and update means for producing said second index data and replacing a code vector stored in said first code book and addressed by said first index data, when the frequency of selection of said code vector stored in said first code book and addressed by said first index data is below a predetermined threshold, with a code vector stored in said second code book and addressed by said second index data; and said decoder comprising:

a third code book for storing a plurality of code vectors at respective addresses;

third addressing means supplied with said coded output from said evaluation means as third index data for selecting a code vector stored in said third code book in response to said third index data;

second synthesis means supplied with said selected code vector from said third code book for producing a synthetic signal that simulates said input signal as a reproduced signal;

a fourth code book for storing a plurality of code vectors at respective addresses;

fourth addressing means supplied with fourth index data for selecting a code vector stored in said fourth code book; and second update means for counting the frequency of selection of the code vectors for each of said code vectors stored in said third code book, said update means producing said third index data and said fourth index data for replacing a code vector stored in said third code book and addressed by said third index data, when the frequency of use of said code vector is below a predetermined threshold, with a code vector stored in said fourth code book and addressed by said fourth index data.

10. A coder as claimed in claim 9, wherein said encoder further comprises:

a fifth code book for storing gain code values representing the gain at respective addresses;

fifth addressing means supplied with fifth index data from said evaluation means for selecting a gain code value in said fifth code book; and gain amplifier means supplied with a shape code vector from said first code book via said first addressing means and a gain code value from said fifth code book via said fifth addressing means for amplifying said shape code vector supplied from said first code book with a gain specified by said gain code value from said fifth code book, said coder outputting said fifth index data as part of said coded output.

11. A coder as claimed in claim 10, wherein said decoder further comprises:

a sixth code book for storing gain code values representing the gain at respective addresses; and sixth addressing means supplied with sixth index data from said encoder as said coded output for selecting a gain code value stored in said sixth code book, and gain amplifying means for amplifying said code vector read out from said third code book by said third addressing means with a gain specified by said gain code value read out from said sixth code book by said sixth addressing means.

12. A method for encoding an input signal with a vector-quantizing process, comprising the steps of:

quantizing the input signal usinq only a code vector in a first code book;

detecting a count frequency of use of the code vector stored in the first code book;

identifying code vectors of the first code book of which a frequency of use is smaller than a predetermined threshold; and replacing the code vectors of the first code book thus identified with another code vector stored in a second code book.

* * * * *

UNITED STATES PATENT AND TRADEMARK OFFICE
CERTIFICATE OF CORRECTION

PATENT NO. : 5,524,170

DATED : June 4, 1996

INVENTOR(S) : Matsuo et al.

Page 1 of 2

It is certified that error appears in the above-indentified patent and that said Letters Patent is hereby corrected as shown below:

Title Page, under "References Cited", second column, line 1, "8,068,723" should be --5,068,723-- and add the following new section

--FOREIGN PATENT DOCUMENTS

| | | |
|---|---|---|
| 0241170 | 10/1987 | Europe Pat. Off. |
| 0331094 | 3/1989 | Europe Pat. Off. |
| 0388067 | 9/1990 | Europe Pat. Off. |
| 61-201522 | 9/1986 | Europe |
| 64-85490 | 3/1989 | Japan |
| 2-22934 | 1/1990 | Japan |
| 3-11482 | 5/1991 | Japan |
| 3-222522 | 10/1991 | Japan--. |

Title Page, second column, under "Abstract", line 16, "book:" should be --book;--.

* Column 1, line 25, after "as" insert --a--.

Column 3, line 38, "drawings," should be --drawings.--.

Column 3, line 63, delete "am".

Column 4, line 11, after "FIG. 5" insert --,--.

Column 4, line 42, in the equation, "$E^2=(X_0,-X_0^S)^2+(X_1'-X_1^S)^2$" should be --$E^2=(X_0'-X_0^S)^2+(X_1'-X_1^S)^2$--.

UNITED STATES PATENT AND TRADEMARK OFFICE
CERTIFICATE OF CORRECTION

PATENT NO. : 5,524,170

DATED : June 4, 1996

INVENTOR(S) : Matsuo et al.

It is certified that error appears in the above-indentified patent and that said Letters Patent is hereby corrected as shown below:

* Column 5, line 60, "embodiment" should be
    --embodiments--.

Signed and Sealed this

Fifth Day of August, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,524,170
DATED : June 4, 1996
INVENTOR(S) : Matsuo et al.

It is certified that error appears in the above-identified patent and that said Letters Patent is hereby corrected as shown below:

Title page,
Item [56], References Cited, U.S. PATENT DOCUMENTS, "8,068,723" should be -- 5,068,723 --; and add the following new section
-- FOREIGN PATENT DOCUMENTS

| | | |
|---|---|---|
| 0241170 | 10/1987 | Europe |
| 0331094 | 3/1989 | Europe |
| 0388067 | 9/1990 | Europe |
| 61-201522 | 9/1986 | Europe |
| 64-85490 | 3/1989 | Japan |
| 2-22934 | 1/1990 | Japan |
| 3-11482 | 5/1991 | Japan |
| 3-222522 | 10/1991 | Japan --. |

Item [57], ABSTRACT,
Line 16, "book:" should be -- book; --.

Column 1,
Line 25, after "as" insert -- a --.

Column 3,
Line 38, "drawings," should be -- drawings. --.
Line 63, delete "am".

Column 4,
Line 11, after "FIG. 5" insert -- , --.
Line 42, in the equation "$E^2=(X_{0'}-X_0^S)^2+(X_1'-X_1^S)^2$" should be -- $E^2=(X_0'-X_0^S)^2+(X_1'-X_1^S)^2$ --.

UNITED STATES PATENT AND TRADEMARK OFFICE
CERTIFICATE OF CORRECTION

PATENT NO. : 5,524,170
DATED : June 4, 1996
INVENTOR(S) : Matsuo et al.

It is certified that error appears in the above-identified patent and that said Letters Patent is hereby corrected as shown below:

Column 5,
Line 60, "embodiment" should be -- embodiments --.

Signed and Sealed this

Eighteenth Day of January, 2005

JON W. DUDAS
*Director of the United States Patent and Trademark Office*